(12) United States Patent
Tsai et al.

(10) Patent No.: US 7,265,060 B2
(45) Date of Patent: Sep. 4, 2007

(54) BI-LEVEL RESIST STRUCTURE AND FABRICATION METHOD FOR CONTACT HOLES ON SEMICONDUCTOR SUBSTRATES

(75) Inventors: Ming Huan Tsai, Hsin-Chu (TW); Hun Jan Tao, Hsin-Chu (TW); Tsang Jiuh Wu, Taichung (TW); Ju Wang Hsu, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 296 days.

(21) Appl. No.: 10/889,416

(22) Filed: Jul. 12, 2004

(65) Prior Publication Data

US 2004/0248414 A1 Dec. 9, 2004

Related U.S. Application Data

(62) Division of application No. 10/357,579, filed on Feb. 4, 2003, now Pat. No. 6,780,782.

(51) Int. Cl.
*H01L 21/302* (2006.01)
(52) U.S. Cl. .................. 438/737; 438/738; 438/780
(58) Field of Classification Search ........... 438/737, 438/738, 780, 736
See application file for complete search history.

(56) References Cited

U.S. PATENT DOCUMENTS

| | | | |
|---|---|---|---|
| 5,227,280 A | 7/1993 | Jubinsky et al. | |
| 5,286,607 A | 2/1994 | Brown | |
| 5,427,649 A | 6/1995 | Kim et al. | |
| 5,545,512 A | 8/1996 | Nakato | |
| 5,773,199 A | 6/1998 | Linliu et al. | |
| 6,037,276 A | 3/2000 | Lin et al. | |
| 6,039,888 A | 3/2000 | Ha et al. | |
| 6,057,587 A | 5/2000 | Ghandehari et al. | |
| 6,080,678 A | 6/2000 | Yim | |
| 6,090,722 A | 7/2000 | Armacost et al. | |
| 6,147,007 A | 11/2000 | Yang et al. | |
| 6,167,257 A | 12/2000 | Lahdemaki | |
| 6,218,292 B1 | 4/2001 | Foote | |
| 6,296,780 B1 * | 10/2001 | Yan et al. | 216/67 |
| 6,479,401 B1 * | 11/2002 | Linliu et al. | 438/763 |
| 6,548,423 B1 * | 4/2003 | Plat et al. | 438/780 |
| 6,617,257 B2 | 9/2003 | Ni et al. | |
| 6,635,583 B2 | 10/2003 | Bencher et al. | |
| 6,777,340 B1 * | 8/2004 | Chiu et al. | 438/700 |
| 2004/0023497 A1 * | 2/2004 | Pan et al. | 438/694 |

* cited by examiner

*Primary Examiner*—Tuan H. Nguyen
(74) *Attorney, Agent, or Firm*—Haynes and Boone, LLP

(57) ABSTRACT

An improved method of etching very small contact holes through dielectric layers used to separate conducting layers in multilevel integrated circuits formed on semiconductor substrates has been developed. The method uses bi-level ARC coatings in the resist structure and a unique combination of gaseous components in a plasma etching process which is used to dry develop the bi-level resist mask as well as etch through a silicon oxide dielectric layer. The gaseous components comprise a mixture of a fluorine containing gas, such as $C_4F_8$, $C_5F_8$, $C_4F_6$, $CHF_3$ or similar species, an inert gas, such as helium or argon, an optional weak oxidant, such as CO or $O_2$ or similar species, and a nitrogen source, such as $N_2$, $N_2O$, or $NH_3$ or similar species. The patterned masking layer can be used to reliably etch contact holes in silicon oxide layers on semiconductor substrates, where the holes have diameters of about 0.1 micron or less.

28 Claims, 5 Drawing Sheets

BI-LEVEL RESIST STRUCTURE AND FABRICATION METHOD FOR CONTACT HOLES ON SEMICONDUCTOR SUBSTRATES

CROSS-REFERENCE

This application is a divisional application of U.S. patent application Ser. No. 10/357,579, filed on Feb. 4, 2003 now U.S. Pat. No. 6,780,782, entitled BI-LEVEL RESIST STRUCTURE AND FABRICATION METHOD FOR CONTACT HOLES ON SEMICONDUCTOR SUBSTRATES, and herein incorporated by reference in its entirety.

BACKGROUND (1) Field of the Invention

This invention relates to a method of fabricating integrated circuits and other electronic devices on semiconductor substrates. More particularly, the invention relates to an improved process for forming contact holes on semiconductor substrates.

(2) Description of Related Art

In the fabrication of semiconductor integrated circuits multilevel integration structures are used to connect the various devices in the circuits. As circuit density increases very large scale integration (VLSI) and ultra-large scale integration (ULSI) are used to interconnect the devices in integrated circuits fabricated on semiconductor substrates and the feature sizes of device components have decreased to 0.1 micron and less. This is particularly true for the contact holes required to connect devices between levels in multilevel structures. Therefore, fabrication processes for achieving VLSI and ULSI levels of integration must be capable of reliably forming contact holes between successive levels, where the contact holes have dimensions of the order of 0.1 micron or less in diameter.

An important challenge in the fabrication of multilevel integrated circuits on semiconductor substrates is to develop masking and etching technologies which allow reliable formation of semiconductor devices, interconnection conducting patterns, and interlevel contact holes which have dimensions of 0.1 micron on less. The masking technologies and the etching technologies must be compatible and result in high fabrication process yield and minimum process cost. In order to minimize cost, fabrication tool throughput must be maximized. Therefore, sequential processing in the same fabrication tool, without necessity to transfer to additional tools, is desirable and leads to reduced product cost.

As device feature size is reduced to 0.1 micron and less, the ability to achieve good image resolution in high density, small pitch patterns requires that the photo resist exposure and imaging processes be performed on a thin photo resist imaging layer. However, when etching features in thick layers, such as ILD (Inter-Level Dielectric) layers, thin photo resist masks are inadequate and schemes to provide more robust masking layers are required.

When circuit density requires that contact holes be of the order of 0.1 micron or less in diameter, resist masking schemes which use a single organic ARC (anti-reflection coating) layer or a single inorganic ARC layer are not adequate. Such single layer ARC schemes result in irregularly shaped etched holes having severe striations which can then contribute to shorting between adjacent contact holes.

Also, when using a bi-level resist structure, comprising a top imaging layer and a bottom dry developed organic layer, as the mask for plasma etching holes in silicon oxide using conventional gaseous mixtures of $C_xF_y$, argon, and $O_2$ the top imaging layer is not removed by the silicon oxide etch process and a residue forms on the top of the top imaging layer during the etching of the silicon oxide. This residue further impacts the successful removal of the top imaging layer by subsequent O2 ashing processes and degrades the fabrication process yield.

The present invention is directed to an improved method of etching very small contact holes through dielectric layers used to separate patterned conducting layers in multilevel integrated circuits formed on semiconductor substrates. The method uses bi-level ARC coatings in the resist structure and a unique combination of gaseous components in a plasma etching process which can be used to dry develop the bi-level resist mask as well as etch through a silicon oxide dielectric layer. Contact holes formed using this improved method may be used to make contact to active devices formed within the semiconductor substrate or the contact holes may be used to make contact between successive layers in multilevel integrated circuit structures.

SUMMARY

It is a general object of the present invention to provide an improved method for forming a patterned masking layer on the top surface of a semiconductor substrate using a multilevel resist structure.

Another object of the present invention is to provide an improved method of forming contact holes through dielectric layers on a semiconductor substrate, where the contact holes have a diameter of about 0.1 micron or less.

Still another object of the present invention is to provide an improved, high yield method of forming contact holes through a dielectric layer on a semiconductor substrate, where the contact holes have a diameter of about 0.1 micron.

And, yet another object of the present invention is to provide an improved method of forming contact holes through a dielectric layer on a semiconductor substrate where the fabrication process uses the same plasma etching tool to dry develop the image in the resist mask and to sequentially etch the holes in the dielectric layer.

In one embodiment of the present invention, the above and other objectives are realized by using a method of forming a contact hole on a semiconductor substrate comprising the steps of: providing a semiconductor substrate having formed thereon a layer of first material and a second layer of dielectric material formed on the top surface of the layer of first material; providing a first ARC layer comprising an inorganic material on the top surface of the second layer of dielectric material; providing a second ARC layer comprising an organic material on the top surface of the first ARC layer; providing a patterned mask layer on the top surface of the second ARC layer, wherein the patterned mask layer has holes therein, said holes being open to the top surface of the second ARC layer; performing a first anisotropic etching process in an RF or microwave generated plasma to remove the second ARC layer comprising an organic material and the first ARC layer comprising an inorganic material at the sites of the holes in said patterned mask layer; continuing said first anisotropic etching process in an RF or microwave generated plasma to remove the second layer of dielectric material at the sites of the holes in the patterned mask layer; performing a second anisotropic etching process in an RF or microwave generated plasma to remove the layer of first material at the sites of etched holes in said second layer of dielectric material; and performing a plasma stripping process to remove the remaining patterned mask layer and the remaining second ARC layer comprising an organic material.

In another embodiment of the present invention, the above and other objectives are realized by using a method of forming a contact hole on a semiconductor substrate comprising the steps of: providing a semiconductor substrate having formed thereon a layer of first material and a layer of dielectric material formed on the top surface of the layer of first material; providing a bottom ARC layer comprising a non-silicon containing organic material on the top surface of the layer of dielectric material; providing a top ARC layer comprising a silicon containing organic material on the top surface of the bottom ARC layer comprising a non-silicon containing organic material; providing a patterned mask layer on the top surface of the top ARC layer, wherein the patterned mask layer has holes therein, said holes being open to the top surface of the top ARC layer; performing a first anisotropic etching process in an RF or microwave generated plasma to remove the top ARC layer comprising a non-silicon containing organic material at the sites of the holes in said patterned mask layer; continuing said first anisotropic etching process in an RF or microwave generated plasma to remove the bottom ARC layer of non-silicon containing organic material at the sites of the holes in said patterned mask layer; and further comprising the steps of: continuing the first anisotropic etching process in an RF or microwave generated plasma to remove said layer of dielectric material at the sites of the holes in said patterned mask layer, said first anisotropic etching process simultaneously removing the patterned mask layer on the top surface of the top ARC layer; performing a second anisotropic etching process in an RF or microwave generated plasma to remove the layer of first material at the sites of etched holes in said layer of dielectric material; and performing a plasma stripping process to remove the remaining patterned mask layer and the remaining top ARC layer comprising a silicon containing organic material and bottom ARC layer comprising a non-silicon containing organic material.

BRIEF DESCRIPTION OF THE DRAWINGS

The object and other advantages of this invention are best described in the preferred embodiments with reference to the attached drawings that include.

WRITTEN DESCRIPTION

The new and improved method of forming a patterned masking layer on the top surface of a semiconductor substrate using a multilevel resist structure and the method of forming contact holes through dielectric layers on a semiconductor substrate, where the contact holes have a diameter of about 0.1 micron or less will now be described in detail.

Figure 1A:
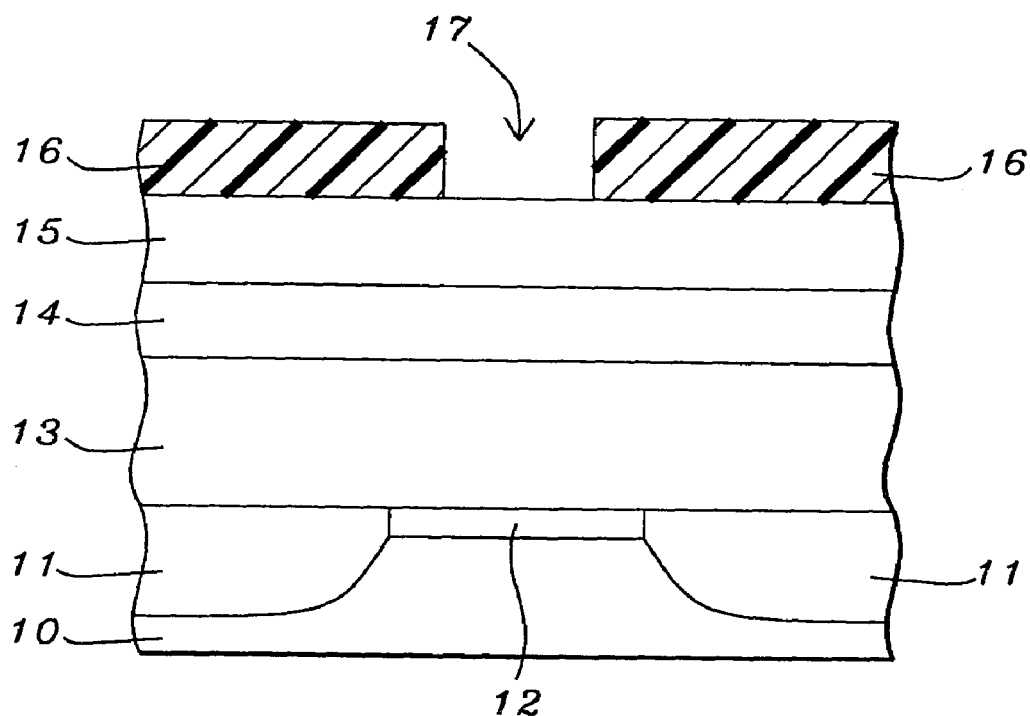
FIGS. 1A and 1B, which in cross-sectional representation illustrate the method of one embodiment of the present invention.
Figure 1B:
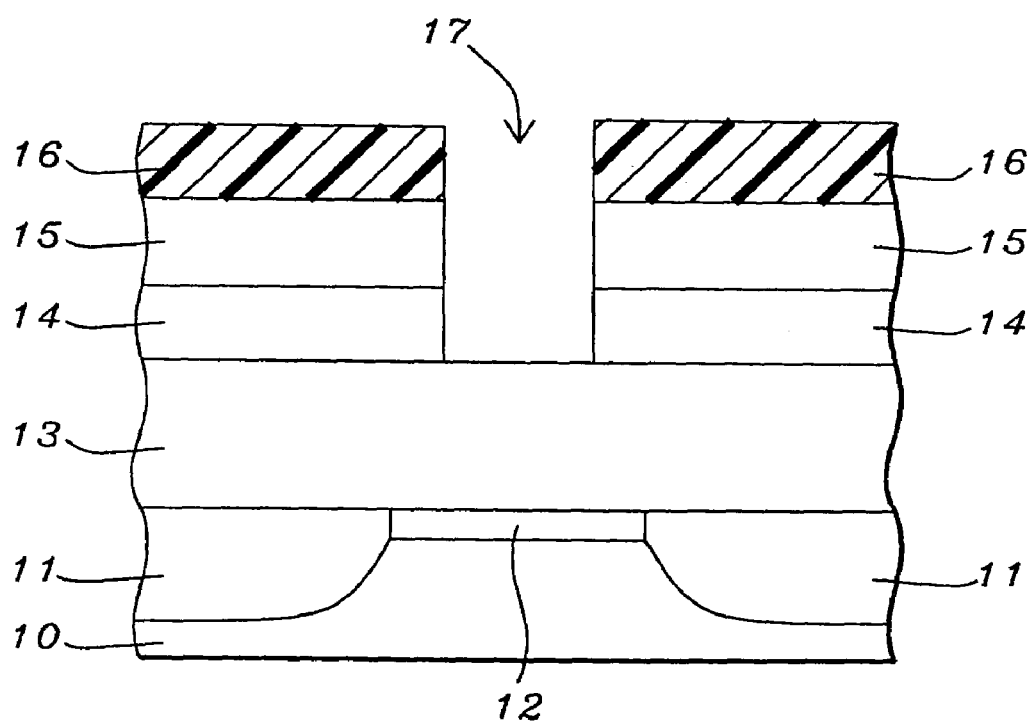

Please refer to FIGS. 1A and 1B, which in cross-sectional representation illustrate the method of one embodiment of the present invention. Referring to FIG. 1A, a semiconductor substrate 10 is provided and the semiconductor substrate 10 comprises isolation areas 11, which may contain an active area 12 and a dielectric layer 13. The isolation areas 11 may be silicon oxide or other dielectrics. The active area 12 may comprise titanium silicide or other silicides. The dielectric layer 13 may be silicon oxide or other suitable insulating materials. Formed on the top surface of the semiconductor substrate is an inorganic ARC layer 14. Inorganic ARC layer 14 comprises SiON and has a thickness between about 100 and 1000 Angstroms. Next, an organic ARC layer 15 is formed over the inorganic ARC layer 14. The organic ARC layer 15 has a thickness between about 100 and 1000 Angstroms, Layer 16 is a patterned resist layer formed over the organic ARC layer 15. Conventional exposure and development processes are used to form the desired pattern in the resist layer and to form holes in the resist layer at sites where contacts are to be made on the semiconductor substrate. Illustrated is one such hole 17, which exposes the underlying organic ARC layer 15.

Now referring to FIG. 1B, the semiconductor substrate having thereon the structure illustrated in FIG. 1A is loaded into a plasma etch tool and exposed to a plasma etching environment generated by RF or microwave power in a gaseous mixture of a fluorine containing gas, such as C4F8, C5F8, C4F6, CHF3 or similar species, an inert gas, such as helium or argon, an optional weak oxidant, such as CO or O2 or similar species, and a nitrogen source, such as N2, N2O, or NH3 or similar species for a time sufficient to etch through the organic ARC layer 15 and the inorganic ARC layer 14. A plasma generated in a gaseous mixture comprising C4F6, CF4, CHF3, O2 and argon, where the volume ratios of gases, C4F6, CF4, CHF3, O2 are about 1:10:3:3, has been used to etch through both the organic ARC layer 15 and the inorganic ARC layer 14. The plasma etching environment has a pressure between about 5 and 50 mTorr and the plasma is generated by RF power between about 100 and 900 Watts, applied to an upper electrode and RF power between about 900 and 2000 Watts, applied to a lower electrode in a dual electrode plasma etch tool.

Figure 2A:
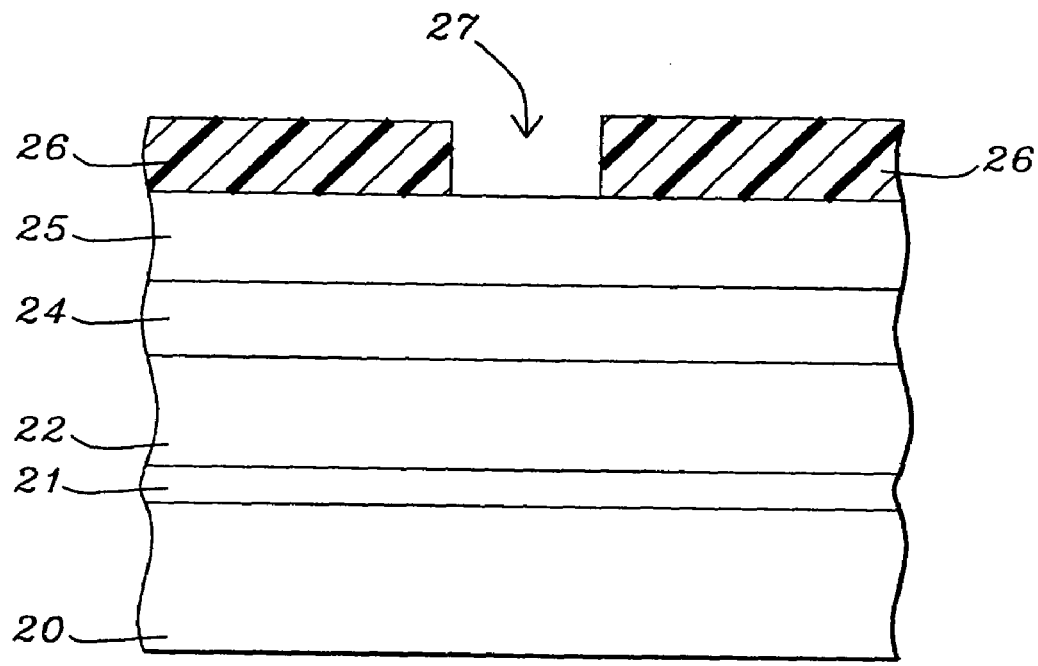
FIGS. 2A-2E, which in cross-sectional representation illustrate the method of a second embodiment of the present invention.

FIGS. 2A-2D illustrate in cross-sectional representation the method of a second embodiment of the present invention. Referring to FIG. 2A, semiconductor substrate 20 has a layer of first material 21 formed thereon. A second layer of dielectric material 22 is formed on the top surface of the layer of first material 21. Semiconductor substrate 20 may be silicon, germanium or other such semiconductors. The layer of first material 21 is a dielectric, such as silicon nitride or SiON having a thickness between about 100 and 1000 Angstroms. The layer of first material 21 acts as an etch stop when etching holes in the second layer of dielectric material 22, which comprises silicon oxide having a thickness between about 3000 and 10,000 Angstroms. Formed on the top surface of second layer of dielectric material 22 is a first inorganic ARC layer 24, which comprises SiON and has a thickness between about 100 and 1000 Angstroms. Next, an organic ARC layer 25 is formed over the inorganic ARC layer 24. The organic ARC layer 25 has a thickness between about 100 and 1000 Angstroms. Layer 26 is a patterned resist layer formed over the organic ARC layer 25. Conventional exposure and development processes are used to form the desired pattern in the resist layer and to form holes in the resist layer at sites where contacts are to be made on the semiconductor substrate. Illustrated is one such hole 27, which exposes the underlying organic ARC layer 25.

Figure 2B:
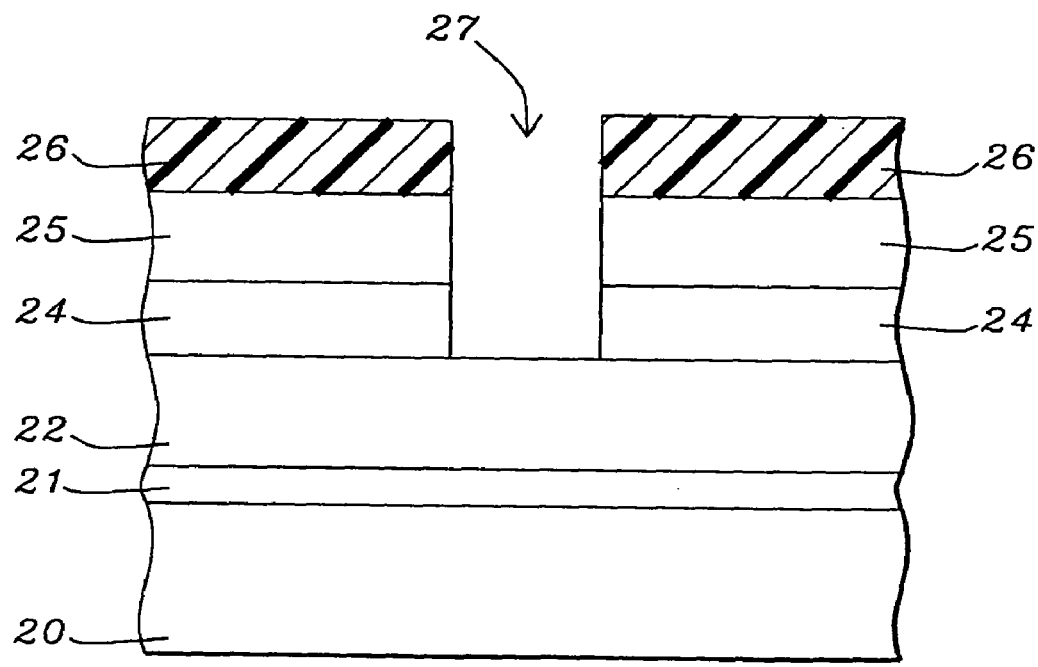

Now referring to FIG. 2B, the semiconductor substrate having thereon the structure illustrated in FIG. 2A is loaded into a plasma etch tool and exposed to a first anisotropic etching process in a plasma etching environment generated by RF or microwave power in a gaseous mixture of a fluorine containing gas, such as C4,F8, C5F8, C4F6, CHF3 or similar species, an inert gas, such as helium or argon, an optional weak oxidant, such as CO or $O_2$ or similar species, and a nitrogen source, such as N2, N20 or NH3 or similar species, for a time sufficient to etch through the organic ARC layer 25 and the inorganic ARC layer 24. A plasma generated in a gaseous mixture comprising C4F6, CF4, CHF3, O2 and argon, where the volume ratios of gases, C4F6, CF4, CHF3, O2 are about 1:10:3:4, has been used to etch through both the organic ARC layer 25 and the inorganic ARC layer 24. The plasma etching environment has a pressure between about 5 and 50 mTorr and the plasma is generated by RF power between about 100 and 900 Watts, applied to an upper electrode and RF power between about 900 and 2000 Watts, applied to a lower electrode in a dual electrode plasma etch tool.

Figure 2C:
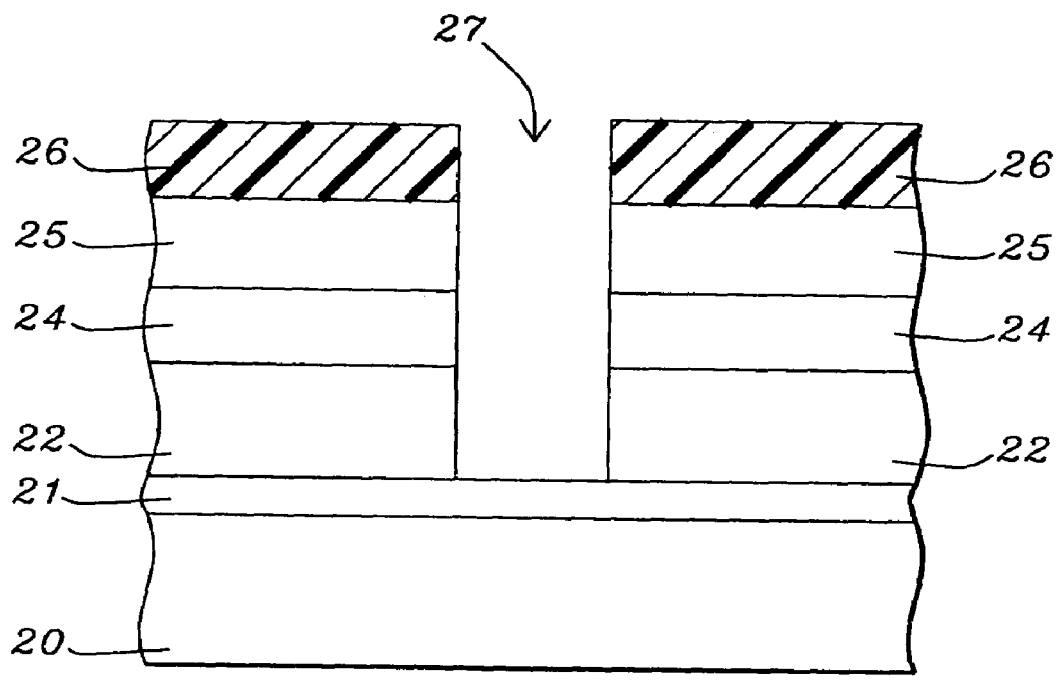

The next step is to continue the first anisotropic etching process, as illustrated in FIG. 2C, to remove the second layer of dielectric material 22 at the site of hole 27. The same plasma etch tool is used and the same gaseous components and etch process parameters as stated above are used for this continuation of the first anisotropic etching process.

Figure 2D:
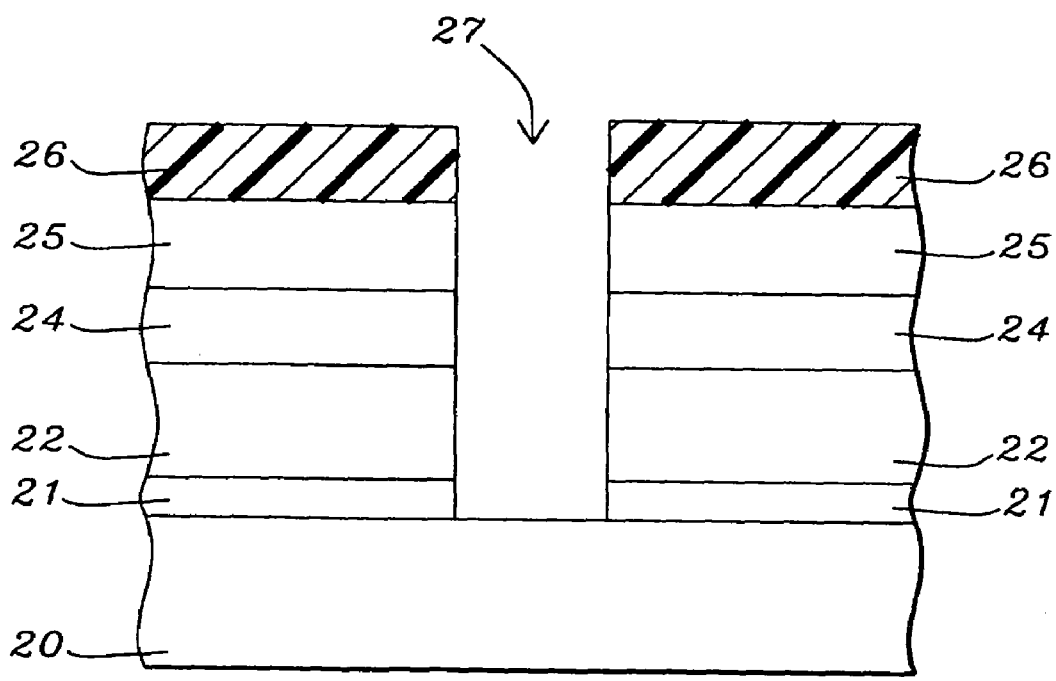

Now referring to FIG. 2D, a second anisotropic etching process is used to remove the layer of first material 21 at the site of hole 27. This second anisotropic etching process is performed in a plasma etching environment in a gaseous mixture of CFx/H2/Ar, CHxFy/H2/Ar, CHxFy/N2/Ar, CHxFy/N2/H2/Ar, CHxFy/O2/Ar or CFx/O2/Ar for a time sufficient to etch through the layer of first material 21 at the site of hole 27.

Figure 2E:
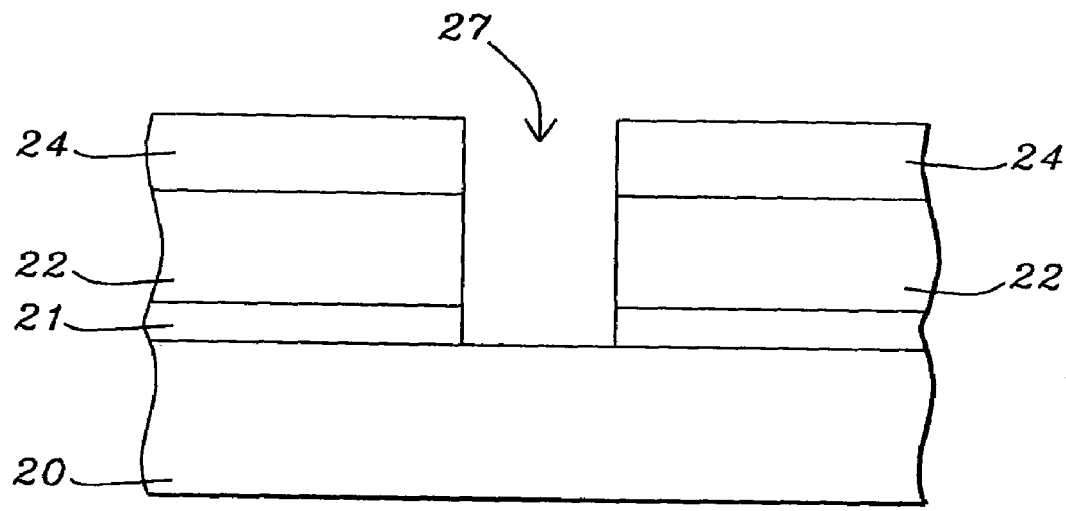

As illustrated in FIGS. 2D and 2E, a plasma stripping process is next used to remove the remaining patterned mask layer 26 and the remaining second ARC layer 25 comprising an organic material to result in the structure as shown in FIG. 2E.

Figure 3A:
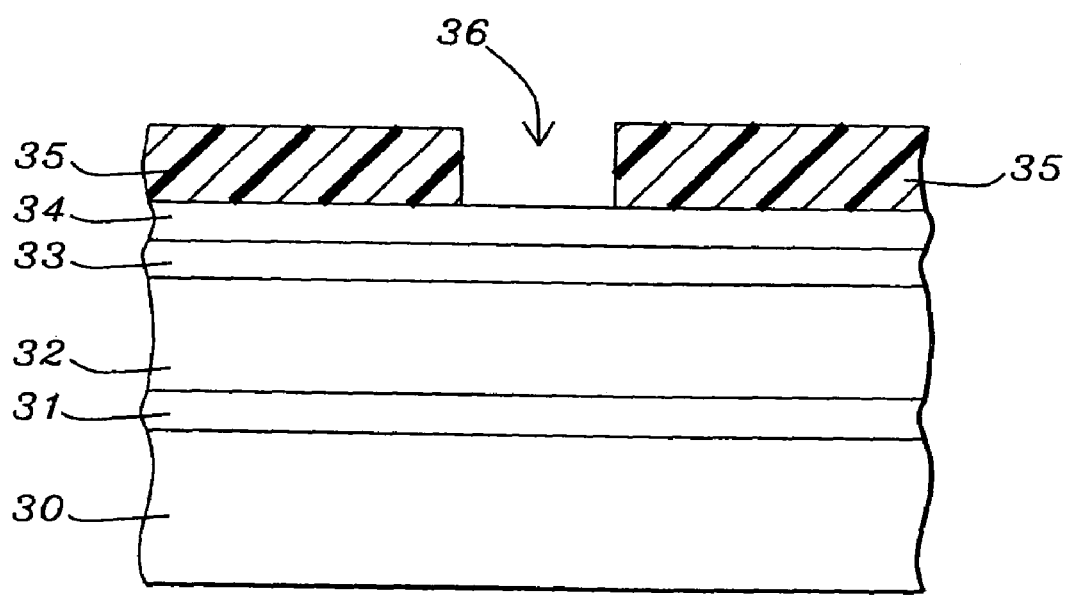
FIGS. 3A-3D, which in cross-sectional representation illustrate the method of a third embodiment of the present invention.

Another method for forming a contact hole on a semiconductor substrate is illustrated in FIGS. 3A-3D. Referring to FIG. 3A, a semiconductor substrate 30 is provided, having thereon a layer of first material 31, comprising a dielectric, such as silicon nitride or SiON having a thickness between about 100 and 1000 Angstroms. Semiconductor substrate 30 may be silicon, germanium or other such semiconductors. The layer of first material 31 acts as an etch stop when etching holes in the second layer of dielectric material 32, which comprises silicon oxide having a thickness between about 1000 and 20,000 Angstroms. Formed on the top surface of second layer of dielectric material 32 is a bottom ARC layer 33, which comprises a non-silicon containing organic material and has a thickness between about 1000 and 5000 Angstroms. Formed on top of bottom ARC layer 33 is top ARC layer 34, which comprises a silicon containing organic material having a thickness between about 500 to 3000 Angstroms. Layer 35 is a patterned resist layer formed over the top ARC layer 34. Conventional exposure and development processes are used to form the desired pattern in the resist layer and to form holes in the resist layer at sites where contacts are to be made on the semiconductor substrate. Illustrated is one such hole 36, which exposes the underlying top ARC layer 34.

Figure 3B:
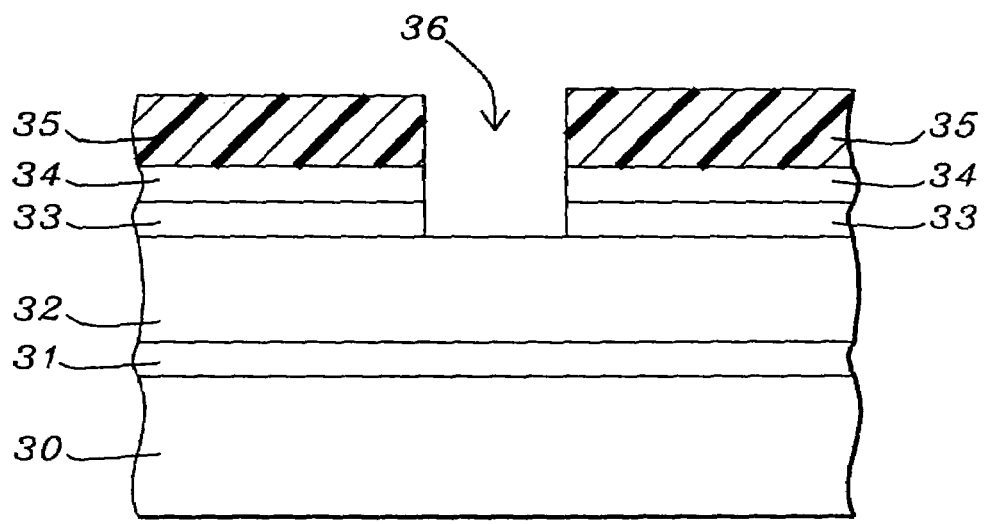

Now referring to FIG. 3B, the semiconductor substrate having thereon the structure illustrated in FIG. 3A is loaded into a plasma etch tool and exposed to a first anisotropic etching process in a plasma etching environment generated by RF or microwave power in a gaseous mixture of a fluorine containing gas, such as C4F8, C5F8, C4F6, CHF3 or similar species, an inert gas, such as helium or argon, an optional weak oxidant, such as CO or $O_2$ or similar species, and a nitrogen source, such as N2, N20 or NH3 or similar species, for a time sufficient to etch through the top ARC layer 34 and the bottom ARC layer 33. A plasma generated in a gaseous mixture comprising C4F6, CF4, CHF3, O2 and argon, where the volume ratios of gases, C4F6, CF4, CHF3, O2, are about 1:10:3:4, has been used to etch through top ARC layer 34 and bottom ARC layer 3. The plasma etching environment has a pressure between about 5 and 50 mTorr and the plasma is generated by RF power between about 100 and 900 Watts, applied to an upper electrode and RF power between about 900 and 2000 Watts, applied to a lower electrode in a dual electrode plasma etch tool.

Figure 3C:
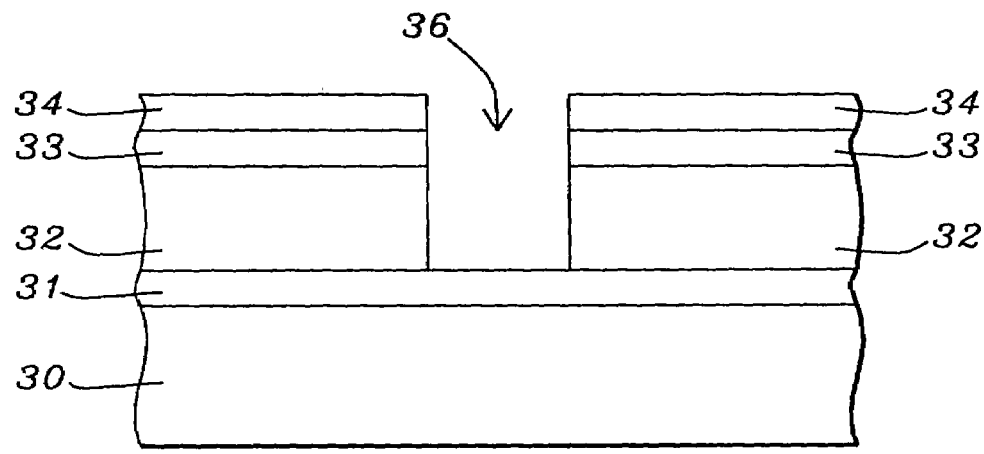

The next step is to continue the first anisotropic etching process, as illustrated in FIG. 3C, to remove the layer of dielectric material 32 at the site of hole 36. The same plasma etch tool is used and the same gaseous components and etch process parameters as stated above are used for this continuation of the first anisotropic etching process. At the same time patterned resist layer 35 is removed from the top surface of top ARC layer 34.

Figure 3D:
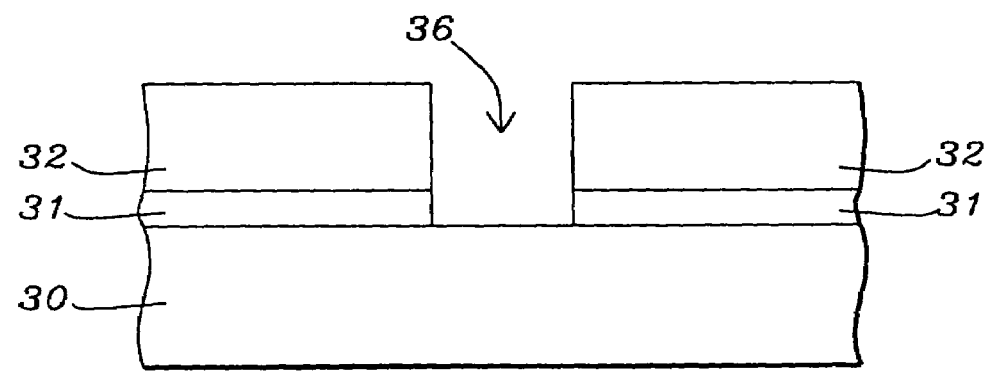

Now referring to FIG. 3D, a second anisotropic etching process is used to remove the layer of first material 31 at the site of hole 35. This second anisotropic etching process is performed in a plasma etching environment in a gaseous mixture of CFx/H2/Ar, CHxFy/H2/Ar, CHxFy/N2/Ar, CHxFy/N2/H2/Ar, CHxFy/O2/Ar or CFx/O2/Ar for a time sufficient to etch through the layer of first material 31 at the site of hole 36. At the same time the remaining ARC layers 33 and 34 are removed from the surface of the layer of dielectric material 32 resulting in the structure illustrated in FIG. 3D.

A plasma stripping process may then be used to remove any remaining organic material from the surface of the structure illustrated in FIG. 3D.

While the invention has been particularly shown and described with reference to the preferred embodiments thereof, it will be understood by those skilled in the art that various changes in form and details may be made without departing from the spirit and scope of the invention.

What is claimed is:

1. A method for forming a contact hole on a semiconductor substrate comprising:
   providing a semiconductor substrate having formed thereon a layer of first material and a second layer of dielectric material formed on the top surface of the layer of first material;
   providing a first ARC layer on the top surface of the second layer of dielectric material;
   providing a second ARC layer comprising an organic material on the top surface of the first ARC layer;
   providing a patterned mask layer on the top surface of the second ARC layer, wherein the patterned mask layer has holes therein, said holes being open to the top surface of the second ARC layer;
   performing a first anisotropic etching process in an RF or microwave generated plasma to remove the second ARC layer and the first ARC layer at the sites of the holes in said patterned mask layer;
   continuing said first anisotropic etching process in an RF or microwave generated plasma to remove the second layer of dielectric material at the sites of the holes in said patterned mask layer;
   performing a second anisotropic etching process in an RF or microwave generated plasma to remove the layer of first material at the sites of etched holes in said second layer of dielectric material; and performing a plasma stripping process to remove the remaining patterned mask layer and the remaining second ARC layer comprising an organic material.

2. The method of claim 1, wherein said layer of first material is a dielectric, which acts as an etch stop when etching holes in said second layer of dielectric material.

3. The method of claim 2, wherein said layer of first material is a dielectric comprising silicon nitride.

4. The method of claim 1, wherein said second layer of dielectric material formed on the top surface of the layer of first material comprises silicon oxide, having a thickness between about 1000 and 20,000 Angstroms.

5. The method of claim 1, wherein the first ARC layer comprises an inorganic material and wherein said first anisotropic etching process is performed in a plasma etching environment generated in a gaseous mixture of a fluorine containing gas, such as $C_4F_8$, $C_5F_8$, $C_4F_6$, $CHF_3$ or similar species, an inert gas, such as helium or argon, an optional weak oxidant, such as CO or $O_2$ or similar species, and a nitrogen source, such as $N_2$, $N_2O$, or $NH_3$ or similar species, for a time sufficient to etch through the organic second ARC layer, the inorganic first ARC layer and the second layer of dielectric material.

6. The method of claim 5, wherein said gaseous mixture comprises $C_4F_6$, $CF_4$, $CHF_3$, $O_2$ and argon.

7. The method of claim 6, wherein the volume ratios of gases, $C_4F_6$, $CF_4$, $CHF_3$, $O_2$ are about 1:10:3:4.

8. The method of claim 1, wherein said first anisotropic etching process is performed at a pressure between about 5 and 50 mTorr and said plasma is generated by RF power between about 100 and 900 Watts, applied to an upper electrode and RF power between about 900 and 2000 Watts, applied to a lower electrode in a dual electrode etching system.

9. The method of claim 1, wherein the first ARC layer comprises an inorganic material and wherein said inorganic ARC layer comprises SiON and has a thickness between about 100 and 1000 Angstroms.

10. The method of claim 1, wherein said organic ARC layer has a thickness between about 100 and 1000 Angstroms.

11. The method of claim 1, wherein said second anisotropic etching process is performed in a plasma etching environment generated in a gaseous mixture of $C_xF_y/H_2/Ar$, $CH_xF_y/H_2/Ar$, $CH_xF_y/N_2/Ar$, $C_xF_y/N_2/Ar$, $C_xF_y/N_2/H_2/Ar$, $CH_xF_y/N_2/H_2/Ar$, $CH_xF_y/O_2/Ar$ or $CF_x/O_2/Ar$ for a time sufficient to etch through the layer of first material at the sites of etched holes in said second layer of dielectric material.

12. The method of claim 1 wherein the first ARC layer is a bottom ARC layer comprising a non-silicon containing organic material and the second layer is a top ARC layer and the organic material contains silicon.

13. The method of claim 12, wherein said first anisotropic etching process simultaneously removes the patterned mask layer on the top surface of the top ARC layer.

14. The method of claim 12, wherein said bottom ARC layer comprising a non-silicon containing organic material has a thickness between about 1000 and 5000 Angstroms.

15. The method of claim 12, wherein said top ARC layer comprising a silicon containing organic material has a thickness between about 500 and 3000 Angstroms.

16. The method of claim 12, wherein said first anisotropic etching process is performed at a pressure between about 10 and 300 mTorr and said plasma is generated by RF power between about 300 and 5000 Watts, applied to an upper electrode and RF power between about 300 and 5000 Watts, applied to a lower electrode in a dual electrode etching system.

17. The method of claim 12, wherein said second anisotropic etching process is performed in a plasma etching environment generated in a gaseous mixture of $C_xF_y/H_2/Ar$, $CH_xF_y/H_2/Ar$, $CH_xF_y/N_2/Ar$, $C_xF_y/N_2/Ar$, $C_xF_y/N_2/H_2/Ar$, $CH_xF_y/N_2/H_2/Ar$, $CH_xF_y/O_2/Ar$ or $CF_x/O_2/Ar$ for a time sufficient to etch through the layer of first material at the sites of etched holes in said second layer of dielectric material.

18. The method of claim 1, wherein said layer of first material has a thickness between about 100 and 1000 Angstroms.

19. The method of claim 1, wherein said layer of dielectric material formed on the top surface of the layer of first material comprises silicon oxide.

20. The method of claim 19, wherein said layer of first material comprises silicon oxide having a thickness between about 1000 and 20,000 Angstroms.

21. The method of claim 1 wherein the layer of first material is a first dielectric layer and wherein the second dielectric layer overlays the first dielectric layer.

22. A method for forming a contact hole on a semiconductor substrate comprising:
providing a semiconductor substrate having formed thereon a first layer of dielectric material and a second layer of dielectric material formed on the first layer of dielectric material, wherein the second layer of dielectric material is different from the first layer of dielectric material;
providing a first ARC layer on the second layer of dielectric material, wherein the first ARC layer contains an inorganic material;
providing a second ARC layer on the first ARC layer, wherein the second ARC layer contains an organic material;
providing a patterned mask layer on the second ARC layer, wherein the patterned mask layer has holes therein, said holes being open to the second ARC layer;
performing a first etching process to remove the second ARC layer and the first ARC layer at the sites of the holes in said patterned mask layer;
continuing said first etching process to remove the second layer of dielectric material at the sites of the holes in said patterned mask layer; and
performing a second anisotropic etching process to remove the first layer of dielectric material at the sites of etched holes in said second layer of dielectric material, wherein the second etching process includes an etchant different from an etchant used in the first etching process.

23. The method of claim 22 wherein the second layer of dielectric material comprises a nitride containing material.

24. The method of claim 22 wherein the first etching process is an anisotropic etching process.

25. The method of claim 22 wherein the first etching process is carried out in an RF or microwave generated plasma.

26. The method of claim 22 further comprising performing a plasma stripping process to remove the remaining patterned mask layer and the remaining second ARC layer comprising an organic material.

27. The method of claim 22 wherein the first etching process comprises a gaseous mixture of a fluorine containing gas.

28. A method for forming a contacts on a semiconductor substrate comprising:
- providing a semiconductor substrate having formed thereon a layer of first material and a second layer of dielectric material formed on the top surface of the layer of first material;
- providing a first ARC layer on the top surface of the second layer of dielectric material;
- providing a second ARC layer comprising an organic material on the top surface of the first ARC layer;
- providing a patterned mask layer on the top surface of the second ARC layer, wherein the patterned mask layer has holes therein, said holes being open to the top surface of the second ARC layer;
- performing a first anisotropic etching process in an RF or microwave generated plasma to remove the second ARC layer and the first ARC layer at the sites of the holes in said patterned mask layer;
- continuing said first anisotropic etching process in an RF or microwave generated plasma to remove the second layer of dielectric material at the sites of the holes in said patterned mask layer;
- performing a second anisotropic etching process in an RF or microwave generated plasma to remove the layer of first material at the sites of etched holes in said second layer of dielectric material;
- performing a plasma stripping process to remove the remaining patterned mask layer and the remaining second ARC layer comprising an organic material; and
- depositing contact material at the sites of the etched holes to form contacts on the semiconductor substrate.

* * * * *